United States Patent [19]

Azpeitia Urrestarazu et al.

[11] Patent Number: 5,021,926
[45] Date of Patent: Jun. 4, 1991

[54] CONSTRUCTION OF BRIDGE RECTIFIERS

[75] Inventors: Angel Azpeitia Urrestarazu, Legazpia; Juan M. Areta Salanueva, Izqda, both of Spain

[73] Assignee: Fagor S. Coop, Mondragon, Spain

[21] Appl. No.: 504,532

[22] Filed: Apr. 4, 1990

[30] Foreign Application Priority Data

Apr. 5, 1989 [ES] Spain .................................... 8901195

[51] Int. Cl.⁵ ........................ H01L 1/12; H01L 23/36; H02B 1/00
[52] U.S. Cl. .................................... 361/436; 361/388; 307/100
[58] Field of Search ................. 361/436, 388; 363/141; 307/100

[56] References Cited

U.S. PATENT DOCUMENTS

| | | | |
|---|---|---|---|
| 3,697,814 | 10/1972 | Christman et al. | 361/388 |
| 3,825,767 | 7/1974 | Shields | 307/100 |
| 4,394,530 | 7/1983 | Kaufman | 361/388 X |
| 4,436,951 | 3/1984 | Rief et al. | 361/388 X |

Primary Examiner—Donald A. Griffin
Attorney, Agent, or Firm—Helfgott & Karas

[57] ABSTRACT

The improvements consist in constructing the bridge cap on the basis of an electrically insulating frame (8) and a dissipating plate (1), such plate comprising an external and larger metal-based layer (4), a thin middle electrically insulating and good heat conducting layer (5) and an internal layer (6), preferably made of copper, on which the tracks (6') are defined to attach, by tin welding, rectifier cells (2) and their relevant connectors (7) and connecting tags (3) to the outside.

1 Claim, 1 Drawing Sheet

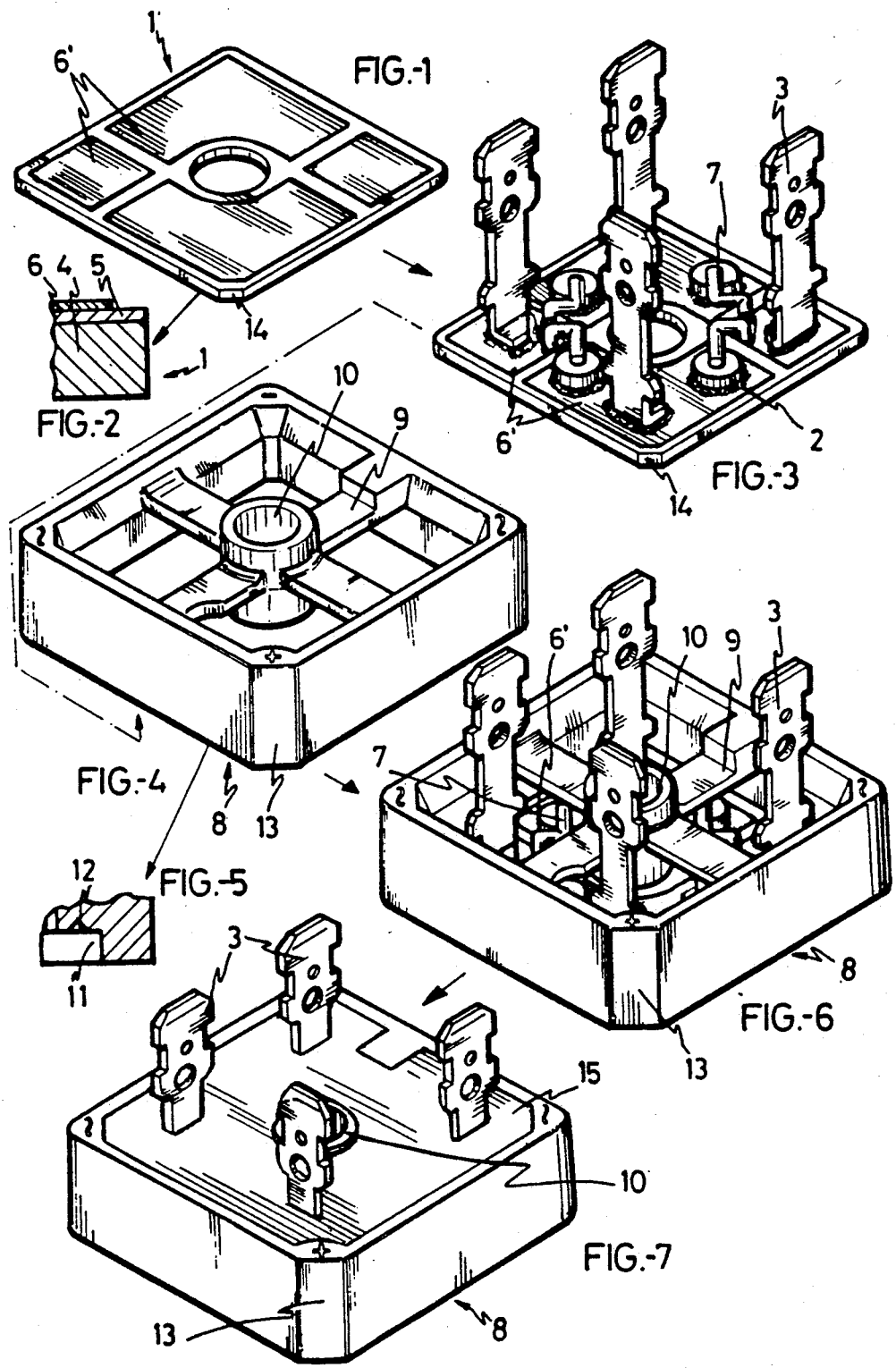

CONSTRUCTION OF BRIDGE RECTIFIERS

OBJECT OF THE INVENTION

The present invention relates to a series of improvements introduced in the construction of bridge rectifiers, such improvements being aimed to enhance the performance of this type of devices, from both the standpoint of electrical insulation and insofar as heat dissipation potential is concerned, viz., the elimination of the heat generated within the same by the rectifier cells forming part thereof.

BACKGROUND OF THE INVENTION

It is a well-known fact that the structure of rectifier bridges, specifically for power ratings ranging between 10 and 50 amperes, is based on a series of duly polarized rectifier cells and on the pertinent external connecting tags. These structural elements obviously essentially belong to the electric rectification circuit, that must in practice be complemented with a physical casing, comprising a cap designed to house the aforesaid elements, in which cap such elements must on the one hand be electrically insulated and on the other be furnished with suitable heat conductivity in order to expedite dissipation of the heat generated by the bridge rectifier cells when the latter are working.

There are solutions in which the said cap is made of electrically insulating, more specifically plastic-based, material, to afford top performance from the standpoint of circuit electric insulation, albeit unfortunately purporting highly stressed problems from the standpoint of heat dissipation.

There are other caps of wholly different design, viz., they are metal-based, with electrically insulating coatings in areas where electric components are established, which solutions fully solve the heat dissipation problem, albeit however entailing a high potential risk of short circuits between the external connecting terminals and the metal cap, since they are both metal-based and hence conductors.

Also attempting to solve these alternative problems, bridge rectifiers are known where the metal cap has been replaced by a cap made of insulating material, though with a metal insertion at its base. The insulation between the metal insertion and the rectifier cells is attained with a coat of the same insulating material making up the cap as such, but this solution nevertheless fails to notably improve the values attained with preceding systems, keeping almost the same trend.

DESCRIPTION OF THE INVENTION

According to the invention, the cap, whilst fulfilling the specifics of electric insulation exacted by the relevant regulations for the time being in force, moreover manages to significantly reduce heat resistance thereof, stemming from a change in the dissipating cap-plate assembly design, to allow attainment of a heat resistance value of around 0.7° C. per watt, for a nominal current of 25 amperes, as opposed to 1.8° C. per watt afforded by conventional solutions for this same nominal current.

To such end and in pursuance of the improvements hereof, the cap comprises a frame of electrically insulating material joined as a single piece to a cylindrical and central core through four ribs or arms projecting radially and equiangularly spaced from such core towards the mid-point of each of the largely quadrangular-shaped frame's arms.

One of the mouths of this frame is provided with a perimetral stepping for coupling of the dissipating plate, which stepping, like the one in the central core, has a slot for housing of the plate attachment adhesive, such plate in turn comprising three layers, a lower, external, metal-based, heat conducting and largest layer, from the standpoint of thickness within the plate as a whole, an electrically insulating and heat conducting middle layer, of little thickness, and a top or internal heat conducting layer, likewise of little thickness, preferably made of copper, from which the relevant "tracks" for connection of the rectifier cells to each other and the threads or tags connecting the bridge rectifier are obtained.

According to another peculiarity of the invention, the dissipating plate has a bevelled apex forming a complement to another bevel existing in the frame that must house the same, such complementary bevels hence defining a single plate position with regard to the frame, preventing chance incorrect assemblies between such elements, which is no doubt an advantage for the user, such area moreover showing a (+) sign to identify circuit terminals.

According to this structure, the rectifier cells and their relevant tags are mounted on the internal surface of the dissipating plate, to which they are mechanically attached, at the same time being electrically connected, with the assistance of tin welding provided on the tracks of the said top or internal dissipating plate surface, this assembly then being coupled to the relevant frame mouth, so that the said tags go through the vanes defined by the arms relating the said frame to its core, the dissipating plate being established in the frame stepping by means of an adhesive, and overall assembly concluding by filling the inside of the cap with an epoxy resin, from which the said bridge rectifier connecting tags or terminals will project.

Optimum heat conduction is thus obtained from the rectifier cells to the dissipating plate, and from the latter to the conventional heater or cooling block attached to the bridge rectifier with the assistance of a screw crossing through its central core.

DESCRIPTION OF THE DRAWINGS

In order to complement the description being made and to assist a better understanding of the peculiarities of the invention, a single set of drawings has been attached to the present specification, as an integral part thereof, showing the following, in an illustrative and non-limiting manner:

FIG. 1—Is a perspective view of a dissipating plate forming part of a bridge rectifier constructed according to the improvements subject hereof.

FIG. 2—Is a rather enlarged and sectional detail of the aforesaid dissipating plate.

FIG. 3—Is another perspective view of the same dissipating plate after the stage when the rectifier cells and relevant connecting terminals thereof are attached to its internal surface.

FIG. 4—Is a perspective view of the complementary electrically insulating frame of the assembly shown in the preceding figure.

FIG. 5—Is a sectional detail of the said frame showing the internal perimetral stepping that houses the dissipating plate.

FIG. 6—Is the assembly of FIG. 3 duly mounted and attached to the frame of FIG. 4.

FIG. 7—Is finally another perspective view of the fully completed bridge rectifier.

PREFERRED EMBODIMENT OF THE INVENTION

In the light of these figures it may be observed that a bridge rectifier constructed according to the improvements subject hereof comprises a dissipating plate (1), designed to house the classic rectifier cells (2), duly connected to each other, and the inevitable and likewise classic connecting terminals (3), the structure of such dissipating plate (1), as shown in sectional detail in FIG. 2, being based on a lower, external and larger metal-based and hence good heat-conducting layer (4), a thin middle electrically insulating layer (5) likewise made of good heat conducting material, and an internal layer (6), preferably made of copper, designed to form the tracks (6') of the bridge rectifier's electric circuit as shown in FIGS. 1 and 2, so that it is precisely on these tracks (6') where the rectifier cells (2) are established, duly connected to each other with the assistance of the connectors (7), such elements being established on the tracks (6') by using molten tin to be spread over all the aforesaid tracks (6') and that shall represent the means of attachment by welding and electric connection of the components, tags and "printed circuit plate" to each other.

This dissipating plate (1) is assisted by a frame (8), shown in full detail in FIG. 4, made from an electrically insulating material, for instance plastic, quadrangularly shaped and provided with internal arms (9) that relate the frame (8) as such to a cylindrical core (10).

One of the mouths of this frame (8) is provided with a perimetral stepping (11) to house the dissipating plate (1), as shown in FIG. (6), which stepping is in turn shown in FIG. 5, its bottom being provided with a small slot (12) expediting accumulation of the adhesive used as means of attachment between these two elements.

Given that the frame (8) is quadrangular in shape, as mentioned hereinbefore, one of its corners is bevelled (13) to form a complement to another bevel (14) provided in the dissipating plate (1), so that only one relative assembling position exists between such elements.

Together with the dissipating plate (1), carrying the relevant circuit to the bridge rectifier, duly attached to frame (8), this assembly forms the classic cap that, as is also usual, is filled with an epoxy or like resin mass (15), definitively sealing the relevant circuit to the bridge rectifier and from which only the connecting tags or terminals (3) project.

According to this structure and as mentioned hereinbefore, the heat generating sources, specifically the rectifier cells (2), are located on a layer of good heat conducting material, specifically on the copper tracks (6') and, through the thin electrically insulating layer (5), also of very good heat conducting material, are connected to the metal plate (4) that is also a good heat conducting means, wherefore heat dissipation is ensured under the best conditions, heat insulation of the bridge contemporaneously posing no problem whatsoever.

It is not considered necessary to extend the present description any further for an expert in the art to understand the scope of the invention and the advantages derived therefrom.

The materials, shape, size and arrangement of the elements may vary, provided this does not imply a modification in the essence of the characteristics of the invention.

The terms used to describe the present specification should be understood to have a wide and non-limiting meaning.

We claim:

1. Improvements in the construction of bridge rectifiers, of the type comprising a series of rectifier cells duly connected to each other, housed within a cap filled with an epoxy or like resin, essentially characterized in that the said cap comprises a dissipating plate (1) and an electrically insulating frame (8), the structure of such dissipating plate being based on three layers, a lower or external layer (4) made of a material with high heat conduction coefficient, preferably metal, being the largest layer within the dissipating plate (1) as a whole, a middle layer (5) made of electrically insulating material, of little thickness and also of good heat conductivity, and finally a top or internal electro-conducting layer (6), preferably made of copper, where tracks (6') are defined for the circuit connecting the rectifier cells (2) and the connections (7) and terminals (3) of such bridge to each other, attached to the said tracks by welding with tin, the mouth of the frame (8) housing the dissipating plate (1) having been provided with a perimetral stepping (11) for coupling thereof, and both the frame (8) and the dissipating plate (1) being bevelled (13-14) at one of their corners to define a single relative position of both elements, with the further peculiarity that the frame (8) is provided with internal arms (9) that relate a central and cylindrical hollow core (10), for bridge attachment, to the mid-point of the sides of the frame as such.

* * * * *